US006787804B1

United States Patent
Yang

(10) Patent No.: US 6,787,804 B1
(45) Date of Patent: Sep. 7, 2004

(54) SEMICONDUCTOR ACCELERATION SENSOR

(75) Inventor: Chien-Sheng Yang, Taipei (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/604,663

(22) Filed: Aug. 8, 2003

(30) Foreign Application Priority Data

May 28, 2003 (TW) .......................................... 92114484 A

(51) Int. Cl.$^7$ .......................... H01L 29/72; H01L 29/76
(52) U.S. Cl. .......................... 257/62; 257/415; 257/417; 257/421; 257/522; 257/618; 257/735; 257/723; 257/418; 257/419; 257/414; 257/420
(58) Field of Search .................................... 257/415, 417, 257/418, 419, 416, 420

(56) References Cited

U.S. PATENT DOCUMENTS 5,239,870 A * 8/1993 Kaneko .................... 73/514.33
5,726,480 A * 3/1998 Pister .......................... 257/415
6,263,734 B1 * 7/2001 Fujii et al. ................ 73/514.34
6,293,149 B1 * 9/2001 Yoshida et al. .......... 73/514.01

* cited by examiner

Primary Examiner—Nathan J. Flynn
Assistant Examiner—Fazli Erdem
(74) Attorney, Agent, or Firm—Winston Hsu

(57) ABSTRACT

A semiconductor acceleration sensor includesa non-single-crystal-silicon-based substrate, an insulating beam structure having a movable section and a stationary section, at least one piezoresistor positioned on the beam structure, an insulating supporter positioned on the non-single-crystal-silicon-based substrate for fixing the stationary section of the beam structure and forming a distance between the beam structure and the non-single-crystal-silicon-based substrate, and a thin film transistor (TFT) control circuit positioned on the non-single-crystal-silicon-based substrate and electrically connected to the piezoresistor and the beam structure.

11 Claims, 2 Drawing Sheets

SEMICONDUCTOR ACCELERATION SENSOR

BACKGROUND OF INVENTION

1. Field of the Invention

The present invention relates to anacceleration sensor, and more specifically, to a semiconductor acceleration sensor with a low production cost and capable of avoiding generating leakage currents, thereby meeting market requirements.

2. Description of the Prior Art

An acceleration sensor is widely applied in seismology, automobilesafety air bag, robotics, and so on. Currently, anacceleration sensor in common use includes a piezoresistiveacceleration sensor, a piezoelectricacceleration sensor, a capacitiveacceleration sensor, and a semi-conductor acceleration sensor.

Additionally, because sizes of the acceleration sensors are reduced gradually, a micromachiningtechnology is developed to manufacture various microsensors and microactuators that are integrated with micro electronic circuits to form a microsystem, which is generally called a micro electromechanical system (MEMS). The MEMS has an extremely small size and can be manufactured by utilizing batch production for reducing a production cost. In addition, the MEMS and a signal processing circuit can be simultaneously formed on a silicon wafer for forming a monolithic device, which can reduce a distance between an acceleration sensor and the signal processing circuit and that is quite important for the acceleration sensor. As the acceleration sensor outputs a signal, the signal is firstly amplified by the signal processing circuit for preventing the signal from being disturbed by an ambient electromagnetic field, and the signal can be analog-to-digital(A/D) converted by the signal processing circuit and be transmitted to a central processing unit. Therefore, as the distance between the acceleration sensor and the signal processing circuit is reduced, signal reliability can be greatly improved, and interconnecting lines and loads of central control systems can be effectively decreased. As a result, the acceleration sensor that is manufactured by use of MEMS is developed rapidly due to its advantages of good detection sensitivity and a low production cost. Additionally, among the above-mentioned kinds of acceleration sensors, the piezoresistiveacceleration sensor has advantages of a high output voltage and high detection sensitivity, while the piezoelectricacceleration sensor has advantages of high detection sensitivity, a low electromagnetic interruption, low power dissipation, high energy density, a fast response, and low sensitivity to an ambient environment. Accordingly, the piezoresistiveacceleration sensor and the piezoelectricacceleration sensor are usually applied on microsensors and microactuators in the MEMS field.

Please refer to FIG. 1. FIG. 1 is a sectional view of a conventional piezoresistive semiconductor acceleration sensor 10. As shown in FIG. 1, the piezoresistive semiconductor acceleration sensor 10 comprises an etched semiconductor substrate 12, such as a single-crystal silicon substrate or a silicon-on-insulator (SOI) substrate. The etched semiconductor substrate 12 includes a beam section 14, an anchor section 16 for supporting the beam section 14, and a weight section 18 positioned on an edge of the beam section 14. Additionally, the piezoresistive semiconductor acceleration sensor 10 further comprisesat least one piezoresistor 20 located in the beam section 14 for being a sensing device of the piezoresistive semiconductor acceleration sensor 10, and a control circuit 22 positioned in the etched semiconductor substrate 12 and electrically connected between the beam section 14 and the piezoresistor 20. The control circuit 22 mainly includes a complementary metal-oxide semiconductor (CMOS), an amplifying circuit, or a logic circuit, and the control circuit 22 is used to receive, process, and transmit signals output from the piezoresistor 20.

For forming the etched semiconductor substrate 12, an anisotropic etching process is performed to etch a reverse side of a semiconductor substrate through use of an etchant, such as potassium hydroxide (KOH), so as to form the beam section 14 and the weight section 18, whose areas and thickness conform to process requirements. Additionally, a portion of the beam section 14 is implanted with boron (B) through use of a thermal diffusing method or an ion implantation process for forming the piezoresistor 20. Because the beam section 14 comprises single-crystal silicon, a p-n junction can be formed after the beam section 14 is implanted with boron (B), and the p-n junction forms the piezoresistor 20 that is used to measure a variation of pressure.

When a vertical acceleration force is applied on the piezoresistive semiconductor acceleration sensor 10, a flexural vibration occurs in the piezoresistive semiconductor acceleration sensor 10 due to the much heavier weight section 18. Because of the flexural vibration, the piezoresistor 20 is deformed and a resistance of the piezoresistor 20 is therefore altered. Thereafter, the control circuit 22 performs a signal process, such as signal amplification or temperature compensation, and the control circuit 22 converts a resistance variation of the piezoresistor 20 into a differential signal. Finally, the control circuit 22 outputs the differential signal. Therefore, the resistance variation of thepiezoresistor 20 that is directly proportional to the acceleration force can be measured, so that the acceleration force to be measured can be obtained.

Additionally, the semiconductor acceleration sensor 10 becomes a piezoelectric semiconductor acceleration sensor if the piezoresistor 20 is formed with a piezoelectric thin film, such as ZnO. The piezoelectric semiconductor acceleration sensoris driven according to the piezoelectric effect. As a vertical acceleration force is applied on the piezoelectric thin film, electric charges are generated at two ends of the piezoelectric thin film and the amount of the electric charges are directly proportional to the acceleration force. Accordingly, the acceleration force can be obtained through measuring a variation of the electric charges.

The conventional piezoresistive semiconductor acceleration sensorand the conventional piezoelectric semiconductor acceleration sensor are both composed of single crystal silicon, so that the conventional semiconductor acceleration sensor 10 has good detection sensitivity. However, a cost of single-crystal silicon is so high that it costs a lot to form the conventional semiconductor acceleration sensor 10. Additionally, since the piezoresistor is formed through use of a thermal diffusing method or an ion implantation process in the prior art, the p-n junction is formed between the piezoresistor and the beam section of single-crystal silicon. Nevertheless, leakage currents are usually generated near the p-n junction, thus disturbing an operation of the sensor.

SUMMARY OF INVENTION

It is therefore a primary objective of the claimed invention to provide a semiconductor acceleration sensor with a low production cost and capable of reducing the abovementioned leakage currents.

According to the claimed invention, a semiconductor acceleration sensor is provided. The semiconductor acceleration sensor comprises a non-single-crystal-silicon-based substrate, an insulating beam structure having a movable section and a stationary section, at least one piezoresistor positioned on the beam structure, an insulating supporter positioned on the non-single-crystal-silicon-based substrate for fixing the stationary section of the beam structure and forming a distance between the beam structure and the non-single-crystal-silicon-based substrate, and a thin film transistor (TFT) control circuit positioned on the non-single-crystal-silicon-based substrate and electrically connected to the piezoresistor and the beam structure.

It is an advantage over the prior art that the semiconductor acceleration sensor of the claimed invention is formed on the non-single-crystal-silicon-based substrate, such as a glass substrate or other insulating substrates, thereby effectively reducing prime costs of raw materials. Additionally, the piezoresistor is composed of polysilicon, so that the claimed invention can avoid generating leakage currents, and improve detection sensitivity and accuracy.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
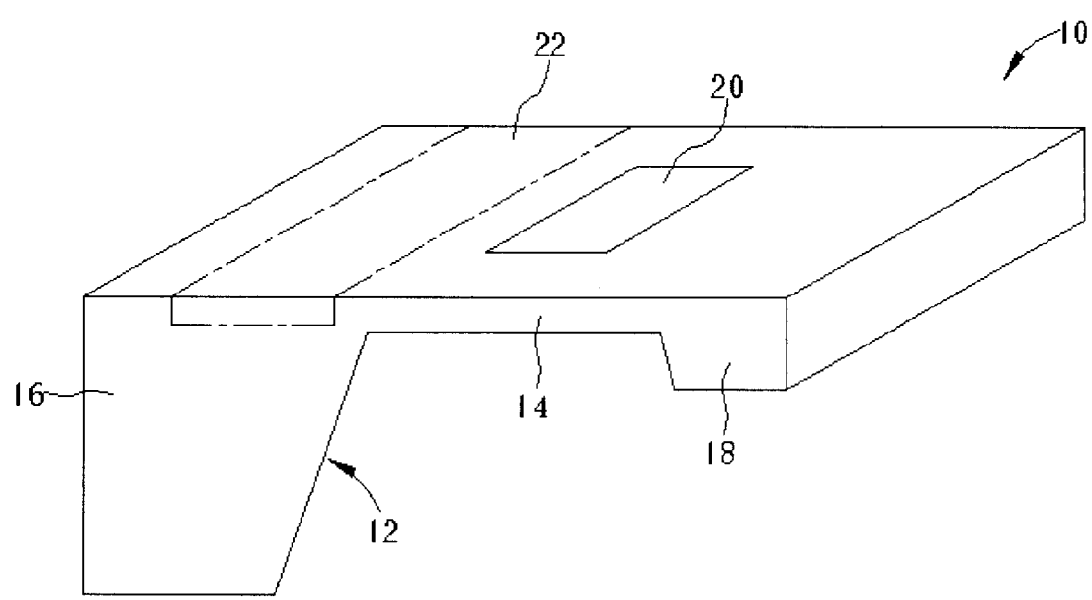
FIG. 1 is a sectional view of a conventional piezoresistive semiconductor acceleration sensor.
Figure 2:
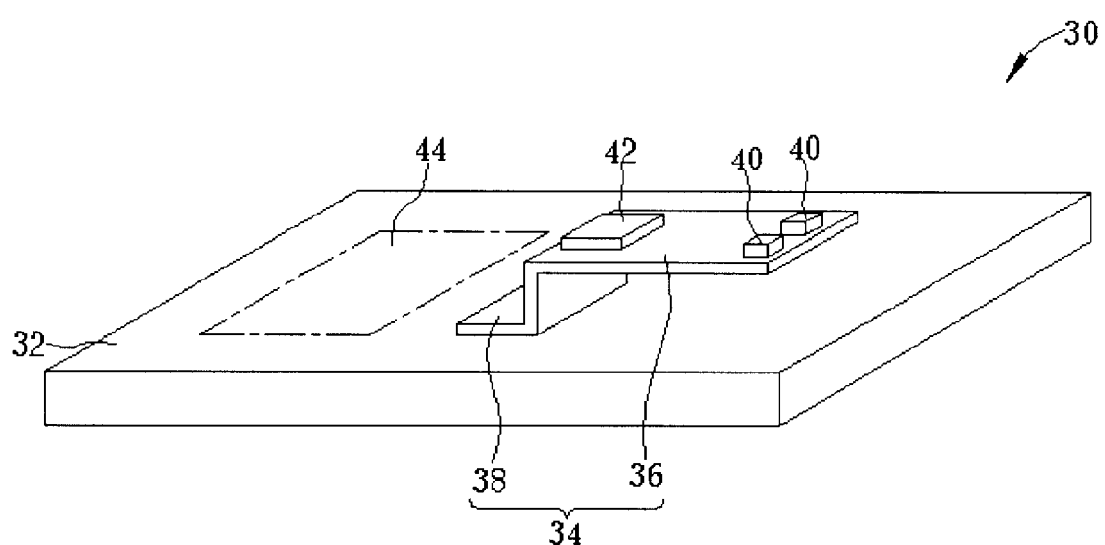
FIG. 2 is a sectional view of a piezoresistive semiconductor acceleration sensor according to the present invention.

Please refer to FIG. 2. FIG. 2 is a sectional view of a piezoresistive semiconductor acceleration sensor 30 according to the present invention. As shown in FIG. 2, the piezoresistive semiconductor acceleration sensor 30 mainly comprises a non-single-crystal-silicon-based substrate 32, an insulating cantilever beam structure 34 including a beam section 36 having a movable section and a stationary section, and a supporter 38 positioned on the non-single-crystal-silicon-based substrate 32 and connected to the stationary section of the beam section 36. Additionally, the piezoresistive semiconductor acceleration sensor 30 further comprises a weight section 40 positioned on an edge of the cantilever beam structure 34, at least one piezoresistor 42 positioned on the beam section 36 of the cantilever beam structure 34, and a control circuit 44, such as a thin film transistor (TFT) control circuit, positioned on the non-single-crystal-silicon-based substrate 32. The TFT control circuit 44 is electrically connected to the piezoresistor 42 and the cantilever beam structure 34 for receiving, processing, and transmitting signals output from the piezoresistor 42. Furthermore, if the piezoresistor 42 is replaced with a piezoelectric thin film (not shown in FIG. 2), the semiconductor acceleration sensor of the present invention is a piezoelectric semiconductor acceleration sensor.

In the preferred embodiment of the present invention, the non-single-crystal-silicon-based substrate 32 is composed of glass. Because the glass substrate 32 has a low melting point, the TFT control circuit 44 has to be a low temperature polysilicon (LTPS) TFT control circuit, which can be formed at a low temperature, thereby preventing the glass substrate 32 from being damaged due to a high temperature.

Additionally, the non-single-crystal-silicon-based substrate 32 can be a quartz substrate in another embodiment of the present invention. Owing to a high melting point of the quartz substrate 32, the TFT control circuit 44 can be a high temperature polysilicon TFT control circuit. In addition, the beam section 36 of the cantilever beam structure 34, the supporter 38, and the weight section 40 can be formed simultaneously or can be formed separately. The cantilever beam structure 34 and the weight section 40 can be composed of insulating materials, such as silicon dioxide. The piezoresistor 42 is composed of doped polysilicon, and the piezoresistor 42 can be formed through use of e-beam evaporation or RF sputtering. The piezoelectric thin film comprises $ZnO$, $BaTiO_3$, or $PbZrTiO_3$ (PZT), and the piezoelectric thin film can be formed through use of e-beam evaporation, RF sputtering, a sol-gel method, or metallo-organic decomposition (MOD). Among the above-mentioned methods of forming the piezoelectric thin film, the MOD can produce a piezoelectric thin film with thicker thickness, good surface properties, and good piezoelectric characteristics.

Likewise, an acceleration force can be measured by the piezoresistor semiconductor acceleration sensor 30 through detecting a resistance variation of the piezoresistor 42. Additionally, the piezoelectric semiconductor acceleration sensor is a resonant force sensor that is driven according to the piezoelectric effect. The piezoelectric semiconductor acceleration sensor utilizes the piezoelectric thin film as a transducer, which is used to detect signals and drive the beam section 36 to resonate. Furthermore, an area of the piezoelectric thin film can be modified to reduce electrical crosstalk, thereby optimizing a detection characteristic of the sensor. The operation of the semiconductor acceleration sensor 30 is the same as that of the conventional semiconductor acceleration sensor 10, and is thereby omitted.

It should be noticed that although the control circuit 44 is formed on the glass substrate 32 in the preferred embodiment of the present invention, the present invention is not confined to that. The control circuit 44 also can be formed on a printed circuit board (PCB) (not shown) and be electrically connected to the cantilever beam structure 34 and the piezoresistor 42 via a flexible printed circuit (FPC) board (not shown). Alternatively, the control circuit 44, maybe including a plurality of integrated circuit (IC) chips, can be directly formed on a FPC board, and the control circuit 44 is electrically connected to the cantilever beam structure 34 and the piezoresistor 42 via the FPC board. Furthermore, a surface of the non-single-crystal-silicon-based substrate 32 further comprises a TFT display area (not shown) for displaying a variation of pressure detected by the semiconductor acceleration sensor 30, thereby making it convenient for users to measure a variation of pressure and to observe measuring results.

In comparison with the prior art, the piezoresistive semiconductor pressure sensor and the piezoelectric semiconductor pressure sensor of the present invention are formed on the glass substrate or other insulating substrate, so that prime costs of raw materials can be reduced considerably. Additionally, the piezoresistor is composed of polysilicon or other piezoelectricmaterials and the piezoresistor can be formed on the beam section through use of evaporation, so that the piezoresistor of the present invention can have a better piezoelectric coefficient and can be bent more largely, thereby avoiding generating leakage currents and improving detection sensitivity and accuracy.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A semiconductor acceleration sensor comprising:
   a non-single-crystal-silicon-based substrate;
   an insulating beam structure having a movable section and a stationary section;
   at least one piezoresistor positioned on the beam structure;
   an insulating supporter positioned on the non-single-crystal-silicon-based substrate for fixing the stationary section of the beam structure and forming a distance between the beam structure and the non-single-crystal-silicon-based substrate; and
   a thin film transistor (TFT) control circuit positioned on the non-single-crystal-silicon-based substrate and electrically connected to the piezoresistor and the beam structure.

2. The semiconductor acceleration sensor of claim 1 wherein the non-single-crystal-silicon-based substrate is a glass substrate.

3. The semiconductor acceleration sensor of claim 2 wherein the TFT control circuit is a low temperature polysilicon TFT control circuit.

4. The semiconductor acceleration sensor of claim 1 wherein the non-single-crystal-silicon-based substrate is a quartz substrate.

5. The semiconductor acceleration sensor of claim 4 wherein the TFT control circuit is a high temperature polysilicon TFT control circuit.

6. The semiconductor acceleration sensor of claim 1 wherein the beam structure and the supporter are formed simultaneously.

7. The semiconductor acceleration sensor of claim 6 wherein the beam structure and the supporter both comprise silicon dioxide.

8. The semiconductor acceleration sensor of claim 1 wherein the piezoresistor comprises doped polysilicon.

9. The semiconductor acceleration sensor of claim 1 wherein the piezoresistor comprises a piezoelectric thin film.

10. The semiconductor acceleration sensor of claim 9 wherein the piezoelectric thin film comprises $ZnO$, $BaTiO_3$, or $PbZrTiO_3$ (PZT).

11. The semiconductor acceleration sensor of claim 1 wherein the non-single-crystal-silicon-based substrate further comprises a thin film transistor display region for displaying a variation of pressure detected by the semiconductor acceleration sensor.

* * * * *